United States Patent
Robinson et al.

(10) Patent No.: US 9,721,849 B2
(45) Date of Patent: Aug. 1, 2017

(54) HIGH PERFORMANCE ISOLATED VERTICAL BIPOLAR JUNCTION TRANSISTOR AND METHOD FOR FORMING IN A CMOS INTEGRATED CIRCUIT

(71) Applicant: Texas Instruments Incorporated, Dallas, TX (US)

(72) Inventors: Derek W. Robinson, Tucson, AZ (US); Amitava Chatterjee, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/255,341

(22) Filed: Sep. 2, 2016

(65) Prior Publication Data
US 2016/0372376 A1    Dec. 22, 2016

Related U.S. Application Data

(62) Division of application No. 14/134,312, filed on Dec. 19, 2013, now Pat. No. 9,461,035.

(Continued)

(51) Int. Cl.
| | |
|---|---|
| *H01L 21/8249* | (2006.01) |
| *H01L 27/06* | (2006.01) |
| *H01L 29/732* | (2006.01) |
| *H01L 29/66* | (2006.01) |
| *H01L 29/10* | (2006.01) |
| *H01L 21/761* | (2006.01) |
| *H01L 21/762* | (2006.01) |
| *H01L 29/78* | (2006.01) |

(52) U.S. Cl.
CPC ........ *H01L 21/8249* (2013.01); *H01L 21/761* (2013.01); *H01L 21/76229* (2013.01); *H01L 27/0623* (2013.01); *H01L 29/1004* (2013.01); *H01L 29/66272* (2013.01); *H01L 29/66659* (2013.01); *H01L 29/732* (2013.01); *H01L 29/7322* (2013.01); *H01L 29/7833* (2013.01); *H01L 29/7835* (2013.01)

(58) Field of Classification Search
CPC ........ H01L 29/7833–29/7836; H01L 27/0623; H01L 29/66659; H01L 29/66272; H01L 29/7322
See application file for complete search history.

(56) References Cited

U.S. PATENT DOCUMENTS

| | | |
|---|---|---|
| 3,753,055 A | 8/1973 | Yamashita et al. |
| 4,550,390 A | 10/1985 | Akashi |

(Continued)

*Primary Examiner* — Yu Chen
*Assistant Examiner* — Nilufa Rahim
(74) *Attorney, Agent, or Firm* — Jacqueline J. Garner; Charles A. Brill; Frank D. Cimino

(57) ABSTRACT

A CMOS integrated circuit containing an isolated n-channel DEMOS transistor and an isolated vertical PNP transistor has deep n-type wells and surrounding shallow n-type wells providing isolation from the p-type substrate. The isolated n-channel DEMOS transistor has an upper n-type layer providing an extended drain, and a lower p-type layer isolating the extended drain from the underlying deep n-type well. The isolated vertical PNP transistor has an upper n-type layer providing a base and a lower p-type layer providing a collector. A CMOS integrated circuit having opposite polarities of the transistors may be formed by appropriate reversals in dopant types.

11 Claims, 14 Drawing Sheets

Related U.S. Application Data

(60) Provisional application No. 61/746,789, filed on Dec. 28, 2012.

(56) References Cited

U.S. PATENT DOCUMENTS

| | | | |
|---|---|---|---|
| 5,356,822 A * | 10/1994 | Lin | H01L 21/8249 148/DIG. 9 |
| 5,374,569 A * | 12/1994 | Yilmaz | H01L 21/8249 148/DIG. 9 |
| 5,455,447 A | 10/1995 | Hutter et al. | |
| 5,883,413 A | 3/1999 | Ludikhuize | |
| 6,563,193 B1 * | 5/2003 | Kawaguchi | H01L 29/735 257/575 |
| 2004/0251517 A1 * | 12/2004 | Nakashima | H01L 21/8249 257/565 |
| 2007/0063274 A1 * | 3/2007 | Kanda | H01L 21/761 257/335 |
| 2009/0179276 A1 | 7/2009 | Voldman | |
| 2010/0213507 A1 | 8/2010 | Ko et al. | |
| 2012/0199878 A1 | 8/2012 | Shrivastava et al. | |
| 2012/0228704 A1 | 9/2012 | Ju | |
| 2013/0200453 A1 | 8/2013 | Park | |

* cited by examiner

HIGH PERFORMANCE ISOLATED VERTICAL BIPOLAR JUNCTION TRANSISTOR AND METHOD FOR FORMING IN A CMOS INTEGRATED CIRCUIT

CROSS-REFERENCE TO RELATED APPLICATIONS

This application is a divisional of U.S. Nonprovisional patent application Ser. No. 14/134,312, filed Dec. 19, 2013, which claims the benefit of U.S. Provisional application Ser. No. 61/746,789, filed Dec. 28, 2012, the contents of both of which are herein incorporated by reference in its entirety.

FIELD OF THE INVENTION

This invention relates to the field of integrated circuits. More particularly, this invention relates to vertical bipolar transistors in integrated circuits.

BACKGROUND OF THE INVENTION

An integrated circuit may be formed using a complementary metal-oxide-semiconductor (CMOS) fabrication process, which includes n-channel metal oxide semiconductor (NMOS) transistors and p-channel metal oxide semiconductor (PMOS) transistors. CMOS offers the advantages of a relatively inexpensive fabrication process, low power dissipation circuits, and transistors that can be tightly packed and scaled. It may be desirable to incorporate a bipolar junction transistor which is electrically isolated from a substrate of the integrated circuit, which has a current gain ($h_{fe}$) greater than 10, and takes up little space. It may further be desirable to integrate the isolated bipolar transistor without increasing cost or complexity of the fabrication process. Forming an isolated bipolar transistor the meets these criteria may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit having a p-type substrate and containing an NMOS transistor, a PMOS transistor, an isolated n-channel drain extended metal oxide semiconductor (DEMOS) transistor, and an isolated vertical PNP bipolar transistor, may be formed by a process sequence which includes forming deep n-type wells in the substrate. One deep well extends under the isolated n-channel DEMOS transistor and another deep well extends under the isolated vertical PNP transistor. Shallow n-type wells are formed around the isolated n-channel DEMOS transistor and the isolated vertical PNP transistor; the shallow n-type wells and the deep n-type wells combine to isolate the isolated n-channel DEMOS transistor and the isolated vertical PNP transistor from the substrate. The shallow n-type wells also provide a body region for the NMOS transistor.

An upper n-type layer and a lower p-type layer are formed using a common implant mask. In the isolated n-channel DEMOS transistor, the upper n-type layer provides a drain extension region, and the lower p-type layer isolates the drain extension region from the deep n-type well under the isolated n-channel DEMOS transistor. In the isolated vertical PNP transistor, the upper n-type layer provides a base, and the lower p-type layer provides a collector. A plurality of p-type diffused regions are formed which provide source and drain regions for the PMOS transistor and provide an emitter for the isolated vertical PNP transistor. A plurality of n-type diffused regions are formed which provide a source region for the isolated n-channel DEMOS transistor and provide source and drain regions for the NMOS transistor. The isolated vertical PNP transistor is thus formed advantageously without increasing fabrication cost or complexity of the integrated circuit.

An integrated circuit having an n-type substrate and containing an NMOS transistor, a PMOS transistor, an isolated p-channel drain extended transistor, and an isolated vertical NPN bipolar transistor, may be formed by appropriate reversal of conductivity types and dopant types.

DETAILED DESCRIPTION OF EXAMPLE EMBODIMENTS

Figure 1:
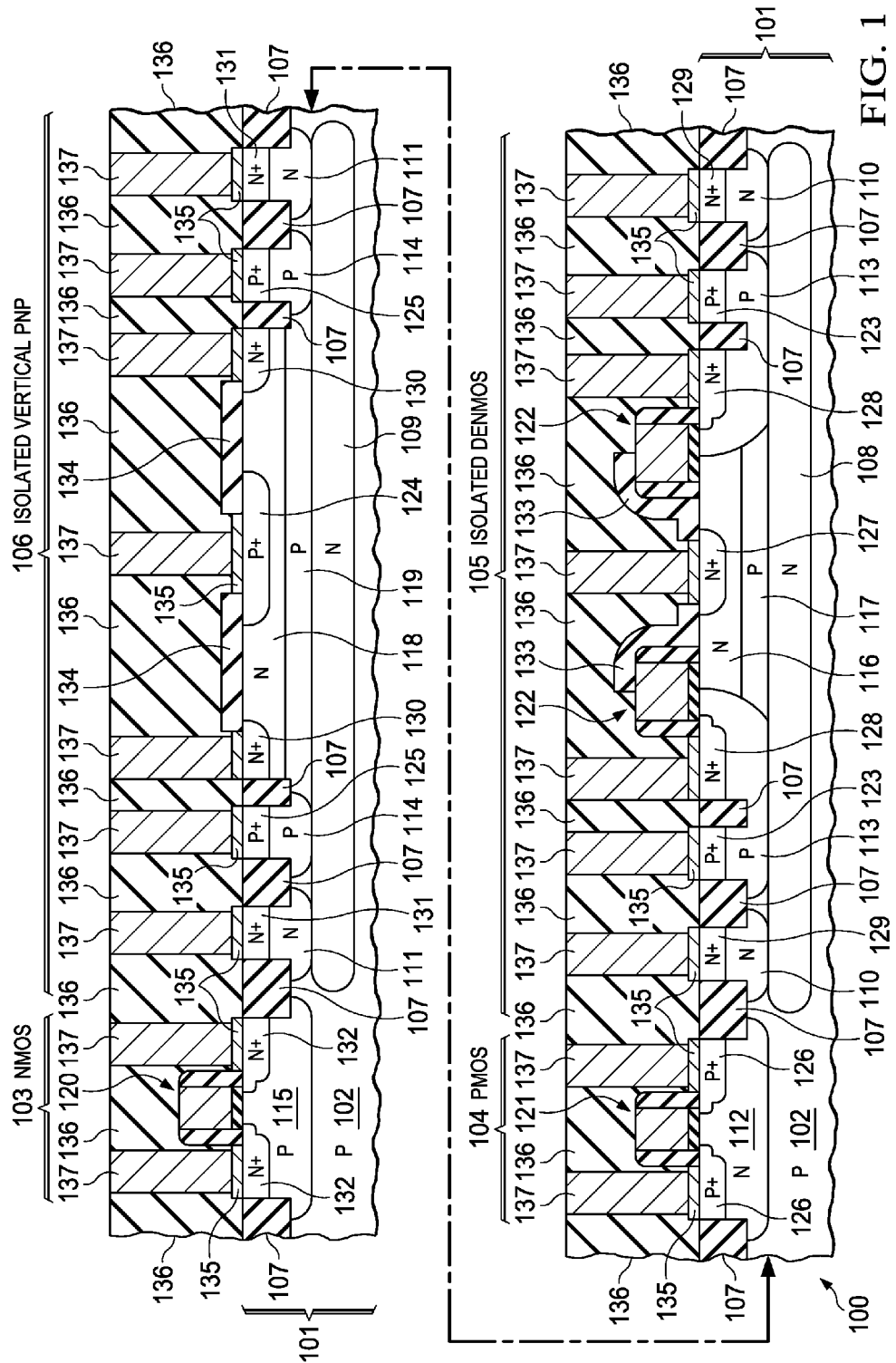
FIG. 1 is a cross section of an example integrated circuit.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Examples herein will be described in terms of one configuration of conductivity types and transistor polarities. A configuration having opposite conductivity types and transistor polarities may be obtained by reversing conductivity types and dopant types. An integrated circuit having a p-type substrate and containing an NMOS transistor, a PMOS transistor, an n-channel isolated n-channel DEMOS transistor, and an isolated vertical PNP bipolar transistor, may be formed by a process sequence which includes forming deep n-type wells in the substrate. One deep well extends under the isolated n-channel DEMOS transistor and another deep well extends under the isolated vertical PNP transistor. Shallow n-type wells are formed around the isolated n-channel DEMOS transistor and the isolated vertical PNP transistor; the shallow n-type wells and the deep n-type wells combine to isolate the isolated n-channel DEMOS transistor and the isolated vertical PNP transistor from the substrate. The shallow n-type wells also provide a body region for the PMOS transistor.

Pairs of upper n-type layer and lower p-type layer are formed using a common implant mask. In the isolated n-channel DEMOS transistor, an upper n-type layer provides a drain extension region, and a lower p-type layer isolates the drain extension region from the deep n-type well under the isolated n-channel DEMOS transistor. In the isolated vertical PNP transistor, an upper n-type layer provides a base, and a lower p-type layer provides a collector. A plurality of p-type diffused regions are formed which provide source and drain regions for the PMOS transistor and provide an emitter for the isolated vertical PNP transistor. A plurality of n-type diffused regions are formed which provide a source region for the isolated n-channel DEMOS transistor and provide source and drain regions for the NMOS transistor. The isolated vertical PNP transistor is thus formed advantageously without increasing fabrication cost or complexity of the integrated circuit.

FIG. 1 is a cross section of an example integrated circuit. The integrated circuit 100 is formed on a substrate 101 which includes p-type semiconductor material 102 extending to a top surface of the substrate 101. The p-type semiconductor material 102 may have an average doping density of, for example, $1 \times 10^{16}$ cm$^{-3}$ to $1 \times 10^{17}$ cm$^{-3}$. The integrated circuit 100 includes an NMOS transistor 103, a PMOS transistor 104, an isolated n-channel DEMOS transistor 105 and an isolated vertical PNP transistor 106. Field oxide 107 is disposed at a top surface of the substrate 101 so as to laterally isolate the NMOS transistor 103, the PMOS transistor 104, the isolated n-channel DEMOS transistor 105 and the isolated vertical PNP transistor 106. The field oxide 107 may be shallow trench isolation (STI) field oxide 107 as depicted in FIG. 1, or may be local oxidation of silicon (LOCOS) field oxide 107.

A first deep n-type well 108 underlies the isolated n-channel DEMOS transistor 105 and a second deep n-type well 109 underlies the isolated vertical PNP transistor 106. In one version of the instant embodiment, the first deep n-type well 108 and the second deep n-type well 109 may be portions of a larger deep n-type well. The deep n-type wells 108 and 109 may have substantially equal average doping densities of, for example, $1 \times 10^{16}$ cm$^{-3}$ to $1 \times 10^{18}$ cm$^{-3}$. A top surface of the deep n-type wells 108 and 109 may be, for example, 1 micron to 1.5 microns below the top surface of the substrate 101, and the deep n-type wells 108 and 109 may be, for example, 1 micron to 1.5 microns thick.

A plurality of shallow n-type wells are disposed in the substrate 101, extending up to the field oxide 107. A first shallow n-type well 110 surrounds the isolated n-channel DEMOS transistor 105, connecting with the first deep n-type well 108 so as to isolate the isolated n-channel DEMOS transistor 105 from the p-type semiconductor material 102 of the substrate 101. A second shallow n-type well 111 surrounds the isolated vertical PNP transistor 106, connecting with the second deep n-type well 109 so as to isolate the isolated vertical PNP transistor 106 from the p-type semiconductor material 102 of the substrate 101. A third shallow n-type well 112 provides a body region for the PMOS transistor 104. The shallow n-type wells 110, 111 and 112 may have an average doping density of, for example, $1 \times 10^{16}$ cm$^{-3}$ to $1 \times 10^{18}$ cm$^{-3}$. In versions of the instant example, any combination of the shallow n-type wells 110, 111 and 112 may be portions of a larger shallow n-type well.

A plurality of shallow p-type wells are disposed in the substrate 101, extending up to the field oxide 107 and to the top surface of the substrate 101. A first shallow p-type well 113 provides a body region for the isolated n-channel DEMOS transistor 105. A second shallow p-type well 114 provides connection to a collector of the isolated vertical PNP transistor 106. A third shallow p-type well 115 provides a body region for the NMOS transistor 103. The shallow p-type wells 113, 114 and 115 may have an average doping density of, for example, $1 \times 10^{17}$ cm$^{-3}$ to $1 \times 10^{18}$ cm$^{-3}$.

A plurality of pairs of upper n-type layers and lower p-type layers are disposed in the substrate 101. A first upper n-type layer 116 provides an extended drain of the isolated n-channel DEMOS transistor 105, and a corresponding first lower p-type layer 117 below the first upper n-type layer 116 so as to isolate the extended drain from the first deep n-type well 108. The first upper n-type layer 116 extends from the top surface of the substrate 101 to the first p-type layer 117, which extends down to the first deep n-type well 108. A second upper n-type layer 118 provides a base of the isolated vertical PNP transistor 106, and a corresponding second lower p-type layer 119 provides the collector of the isolated vertical PNP transistor 106. The second upper n-type layer 118 extends from the top surface of the substrate 101 to the second lower p-type layer 119, which extends down to the second deep n-type well 109. The upper n-type layers 116 and 118 may have average doping densities of, for example, $2 \times 10^{16}$ cm$^{-3}$ to $2 \times 10^{17}$ cm$^{-3}$, and may extend 350 nanometers to 650 nanometers below the top surface of the substrate 101. The lower p-type layers 117 and 119 may have average doping densities of, for example, $4 \times 10^{16}$ cm$^{-3}$ to $8 \times 10^{17}$ cm$^{-3}$.

A plurality of gate structures are disposed on the substrate 101; each gate structure includes a gate dielectric layer at the top surface of the substrate 101, a gate on the gate dielectric layer, and sidewall spacers on lateral surfaces of the gate. A first gate structure 120 provides a gate structure of the NMOS transistor 103. A second gate structure 121 provides a gate structure of the PMOS transistor 104. A third gate structure 122 provides a gate structure of the isolated n-channel DEMOS transistor 105.

A plurality of p-type diffused regions are disposed in the substrate 101. A first p-type diffused region 123 provides a body contact region of the isolated n-channel DEMOS transistor 105. A second p-type diffused region 124 provides an emitter of the isolated vertical PNP transistor 106. A third p-type diffused region 125 provides a collector contact region of the isolated vertical PNP transistor 106. A pair of fourth p-type diffused regions 126 provides source and drain regions of the PMOS transistor 104. An average doping density of the p-type diffused regions 123, 124, 125 and 126 may be, for example, $1 \times 10^{19}$ cm$^{-3}$ to $1 \times 10^{20}$ cm$^{-3}$. The p-type diffused regions 123, 124, 125 and 126 may extend, for example, 100 nanometers to 300 nanometers below the top surface of the substrate 101, but not below the field oxide 107.

A plurality of n-type diffused regions are disposed in the substrate 101. A first n-type diffused region 127 provides a drain contact region of the isolated n-channel DEMOS transistor 105. A second n-type diffused region 128 provides a source region of the isolated n-channel DEMOS transistor 105. A third n-type diffused region 129 provides a contact region of the first shallow n-type well 110 which is part of the isolation of the isolated n-channel DEMOS transistor 105. A fourth n-type diffused region 130 provides a base contact region of the isolated vertical PNP transistor 106. A fifth n-type diffused region 131 provides a contact region of the second shallow n-type well 111 which is part of the isolation of the isolated vertical PNP transistor 106. A pair of sixth n-type diffused regions 132 provide source and drain regions of the NMOS transistor 103. An average doping density of the n-type diffused regions 127, 128, 129, 130, 131 and 132 may be, for example, $1 \times 10^{19}$ cm$^{-3}$ to $1 \times 10^{20}$ cm$^{-3}$. The n-type diffused regions 127, 128, 129, 130, 131 and 132 may extend, for example, 100 nanometers to 300 nanometers below the top surface of the substrate 101, but not below the field oxide 107.

A silicide block layer of silicon nitride and/or silicon dioxide is disposed over the substrate 101 and the gate structures 120, 121 and 122. A first silicide block portion 133 is disposed on the isolated n-channel DEMOS transistor 105 to block metal silicide between the drain contact region 127 and the third gate structure 122. A second silicide block portion 134 is disposed on the isolated vertical PNP transistor 106 to block metal silicide between the emitter 124 and the base contact region 130.

Metal silicide 135, such as platinum silicide, titanium silicide, cobalt silicide, or nickel silicide, may be formed on the p-type diffused regions 123, 124, 125 and 126 and on the n-type diffused regions 127, 128, 129, 130, 131 and 132. The metal silicide 135 may also be disposed on top surfaces of the gate structures 120, 121 and 122. A pre-metal dielectric (PMD) layer 136 is disposed over the substrate 101, the gate structures 120, 121 and 122, and the metal silicide 135. Contacts 137 are disposed through the PMD layer 136 so as to make electrical connections to the p-type diffused regions 123, 124, 125 and 126 and the n-type diffused regions 127, 128, 129, 130, 131 and 132, through the metal silicide 135 if present.

The integrated circuit 100 uses the pairs of upper n-type layers and lower p-type layers for the isolated n-channel DEMOS transistor 105 and for the isolated vertical PNP transistor 106, and uses the p-type diffused regions for the emitter of the isolated vertical PNP transistor 106 and for source, drain and contact regions for the isolated n-channel DEMOS transistor 105 and the PMOS transistor 104, advantageously reducing fabrication cost. Use of the second p-type diffused region 124 for the emitter, the second upper n-type layer 118 for the base and the second lower p-type layer 119 for the collector of the isolated vertical PNP transistor 106 advantageously provides a current gain greater than 10. The integrated circuit 100 uses the deep n-type wells 108 and 109 for isolation of the isolated n-channel DEMOS transistor 105 and the isolated vertical PNP transistor 106, further advantageously reducing fabrication cost.

Figure 2A:
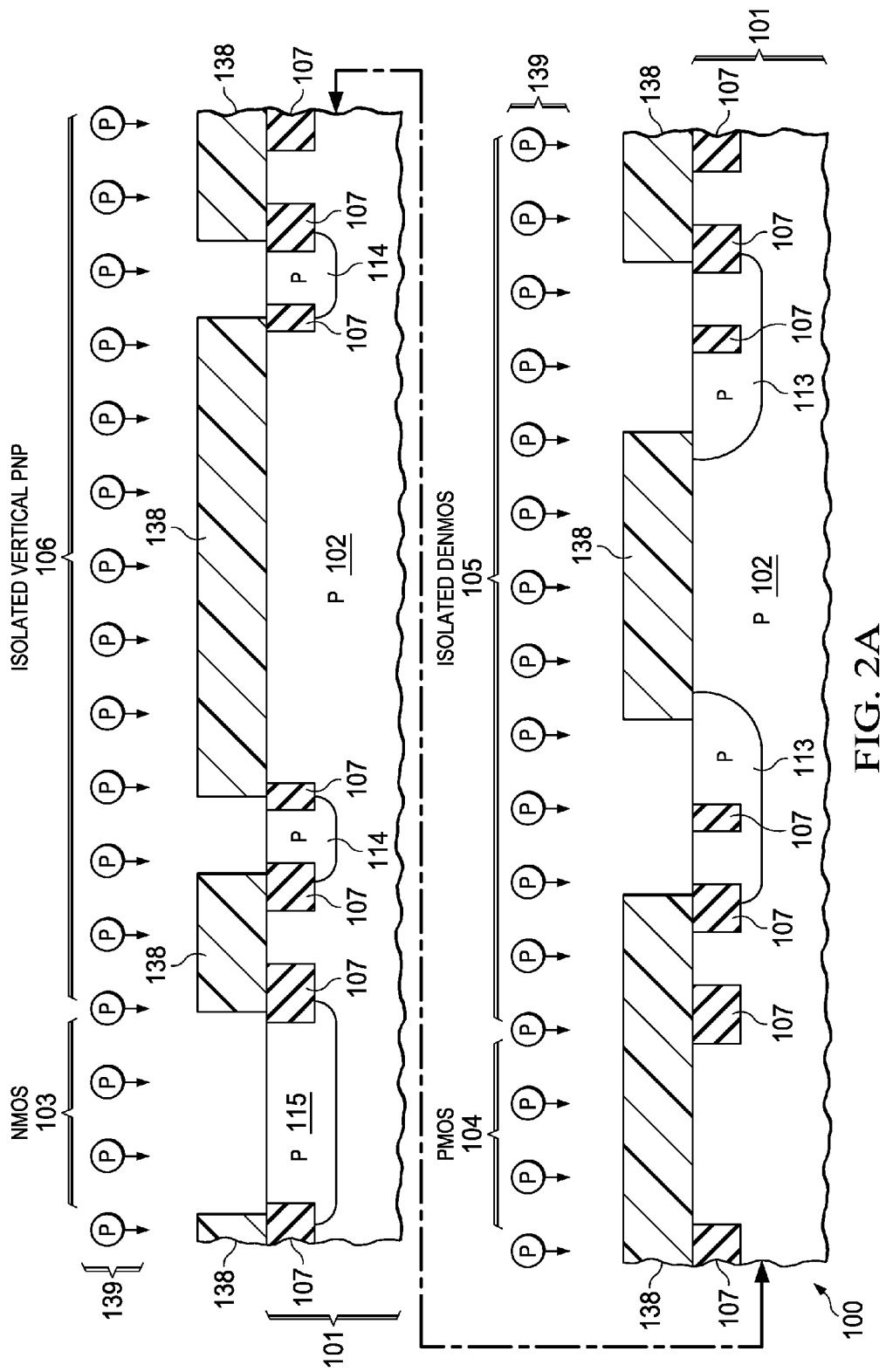
FIG. 2A through FIG. 2I are cross sections of the integrated circuit of FIG. 1, depicted in successive stages of fabrication.

FIG. 2A through FIG. 2I are cross sections of the integrated circuit of FIG. 1, depicted in successive stages of fabrication. Referring to FIG. 2A, the integrated circuit 100 is formed on the substrate 101 which may be, for example, a single crystal silicon wafer, a silicon-on-insulator (SOI) wafer, or other suitable structure. The p-type semiconductor material 102 may be, for example, an epitaxial layer, or may be a top region of a bulk silicon wafer. The field oxide 107 is formed at the top surface of the substrate 101. The field oxide 107 may be formed, for example, using an STI process, or a LOCOS process.

A shallow p-type well mask 138 is formed over the substrate 101 which exposes areas for the shallow p-type wells 113, 114 and 115. P-type dopants 139 such as boron are implanted into the substrate 101 in the areas exposed by the shallow p-type well mask 138. The p-type dopants 139 may be implanted at a dose of, for example, $1 \times 10^{13}$ cm$^{-2}$ to $1 \times 10^{14}$ cm$^{-2}$, and an energy of 100 keV to 300 keV. The shallow p-type well mask 138 is subsequently removed and the substrate 101 is annealed to activate the implanted p-type dopants to form the shallow p-type wells 113, 114 and 115.

Figure 2B:
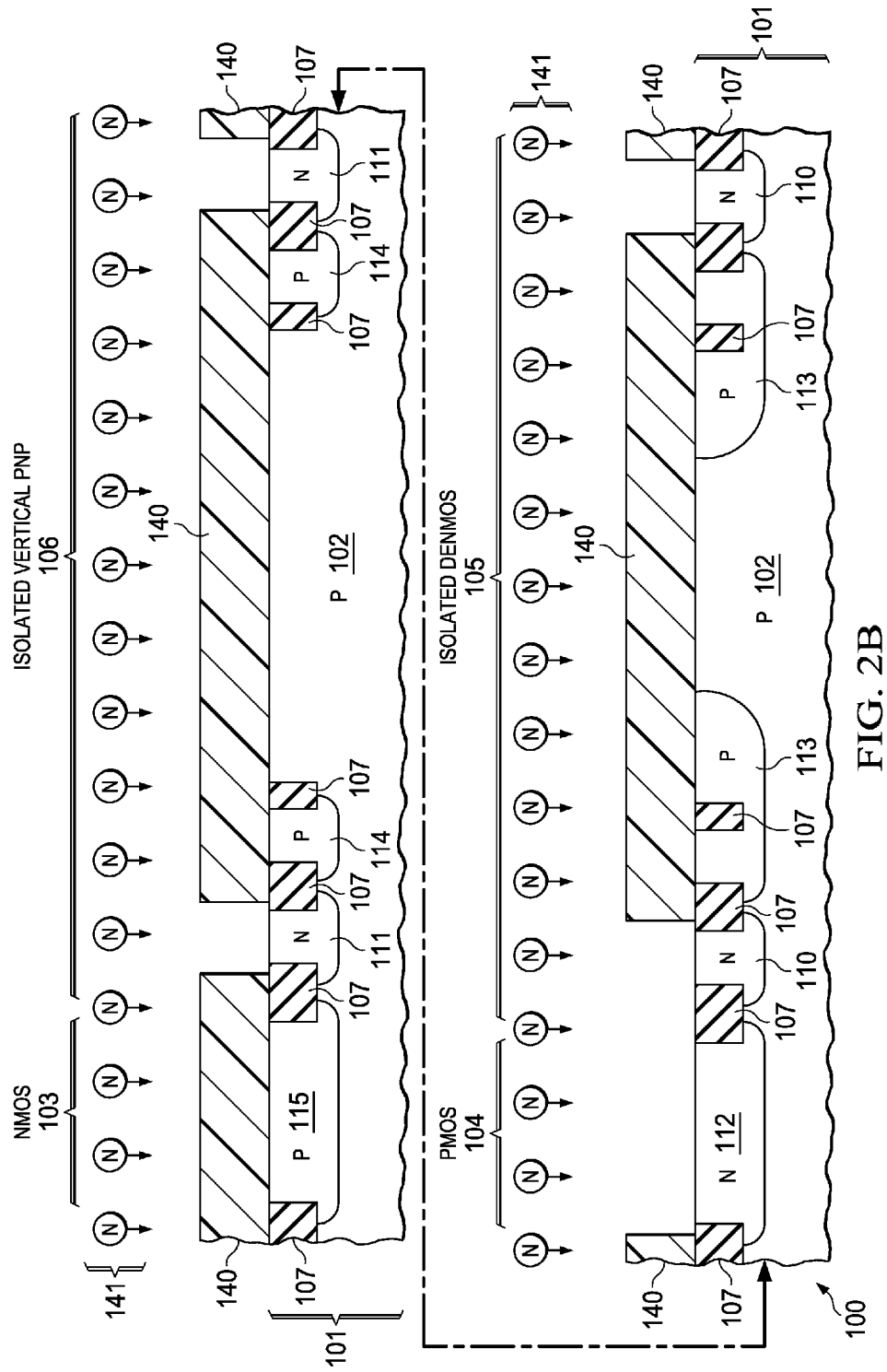

Referring to FIG. 2B, a shallow n-type well mask 140 is formed over the substrate 101 which exposes areas for the shallow n-type wells 110, 111 and 112. N-type dopants 141 such as phosphorus are implanted into the substrate 101 in the areas exposed by the shallow n-type well mask 140. The n-type dopants 141 may be implanted at a dose of, for example, $1 \times 10^{13}$ cm$^{-2}$ to $1 \times 10^{14}$ cm$^{-2}$, and an energy of 250 keV to 500 keV. The shallow n-type well mask 140 is subsequently removed and the substrate 101 is annealed to activate the implanted n-type dopants to form the shallow n-type wells 110, 111 and 112.

Figure 2C:
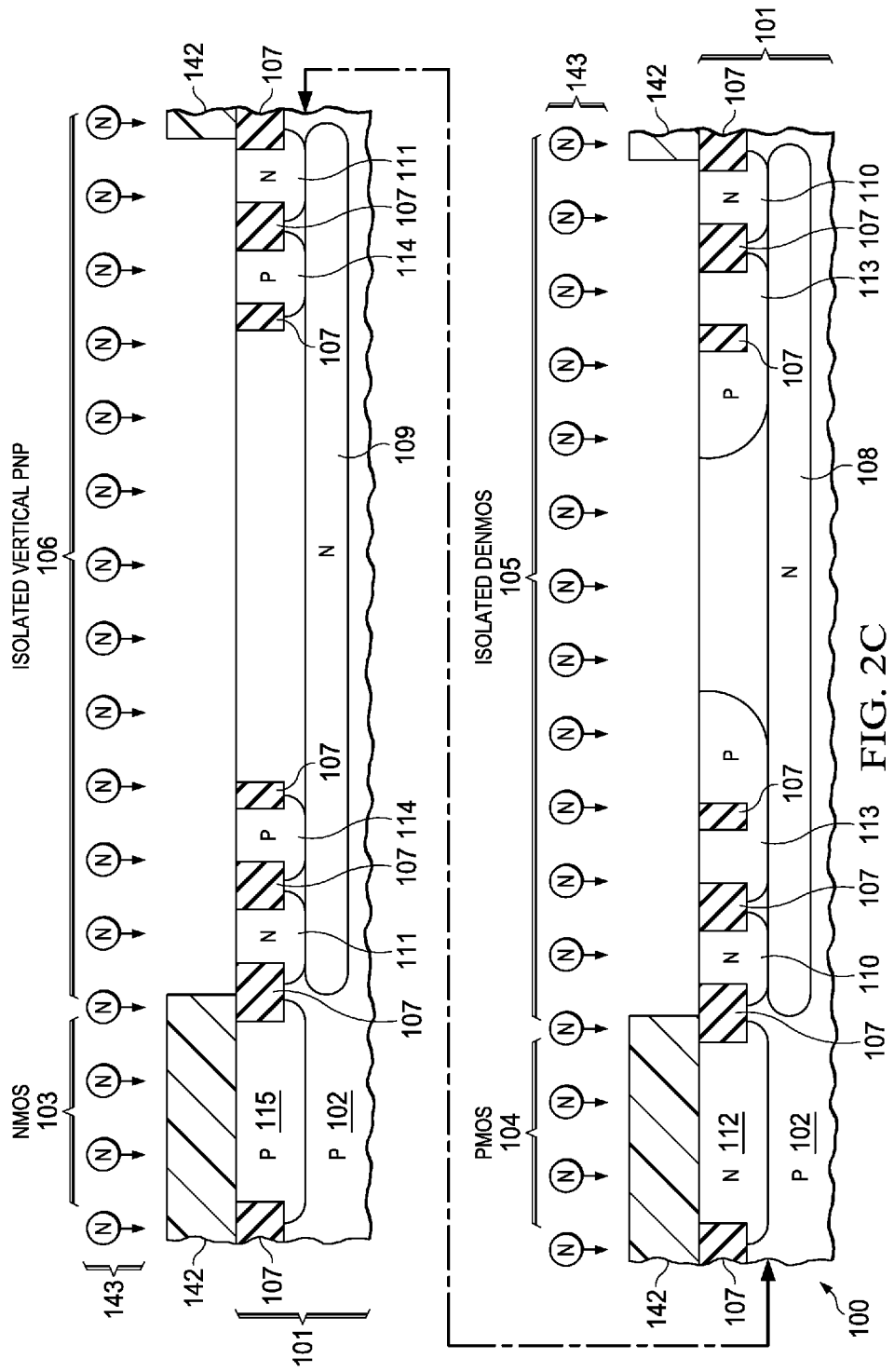

Referring to FIG. 2C, a deep well mask 142 is formed over the substrate 101 which exposes areas for the deep n-type wells 108 and 109. N-type dopants 143 such as phosphorus are implanted into the substrate 101 in the areas exposed by the deep well mask 142. The n-type dopants 143 may be implanted at a dose of, for example, $1 \times 10^{13}$ cm$^{-2}$ to $1 \times 10^{14}$ cm$^{-2}$, and an energy of 600 keV to 1000 keV. The deep well mask 142 is subsequently removed and the substrate 101 is annealed to activate the implanted n-type dopants to form the deep n-type wells 108 and 109.

Figure 2D:
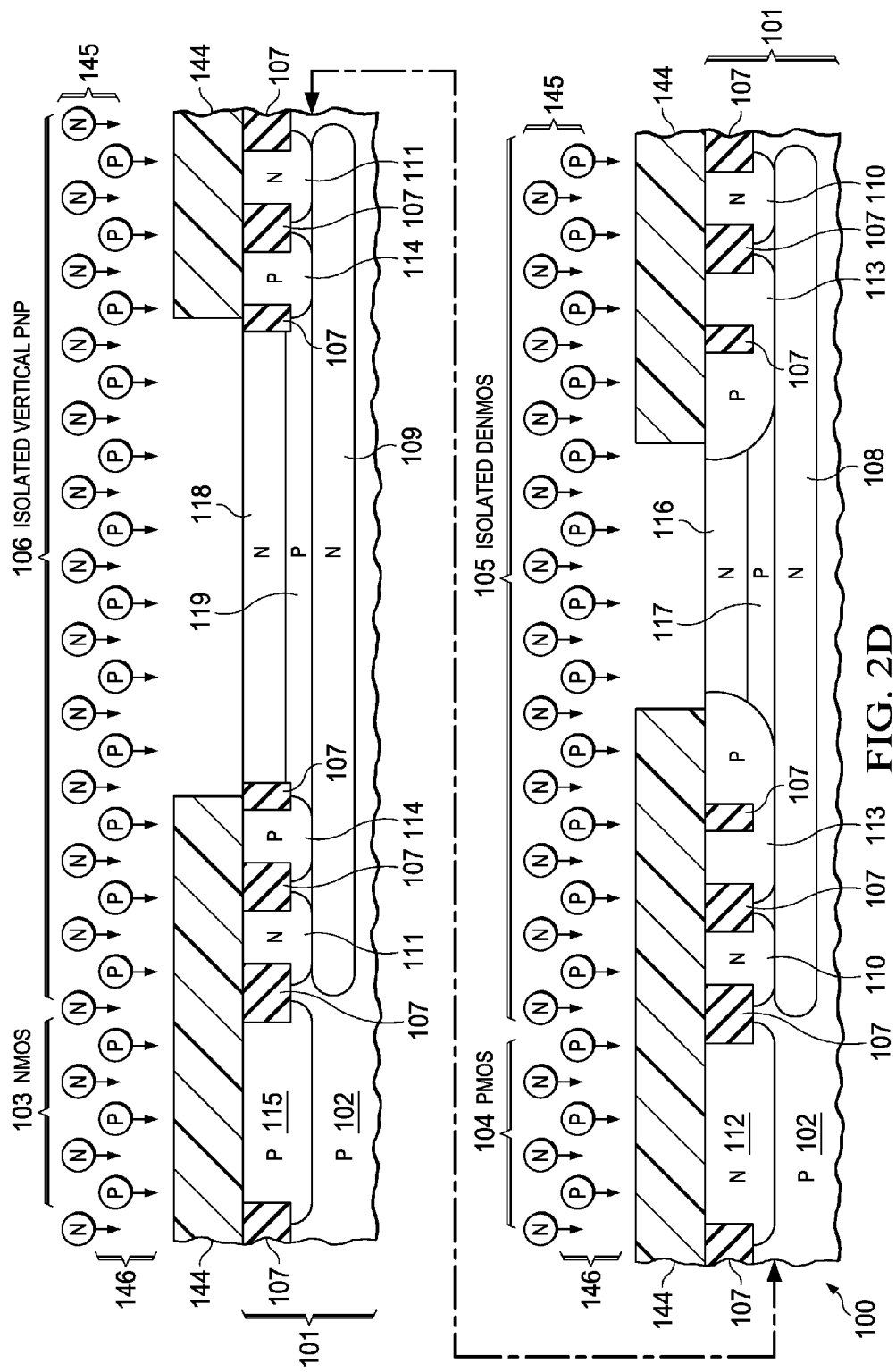

Referring to FIG. 2D, an isolated layer mask 144 is formed over the substrate 101 which exposes areas for the first upper n-type layer 116 and first lower p-type layer 117, and for the second upper n-type layer 118 and the second lower p-type layer 119. N-type dopants 145 such as phosphorus and p-type dopants 146 such as boron are implanted into the substrate in the areas exposed by the isolated layer mask 144. The n-type dopants 145 may be implanted at a dose of, for example, $1 \times 10^{12}$ cm$^{-2}$ to $1 \times 10^{13}$ cm$^{-2}$, and an energy of 150 keV to 250 keV. The p-type dopants 139 may be implanted at a dose of, for example, $6 \times 10^{12}$ cm$^{-2}$ to $4 \times 10^{13}$ cm$^{-2}$, and an energy of 100 keV to 180 keV.

Figure 2E:
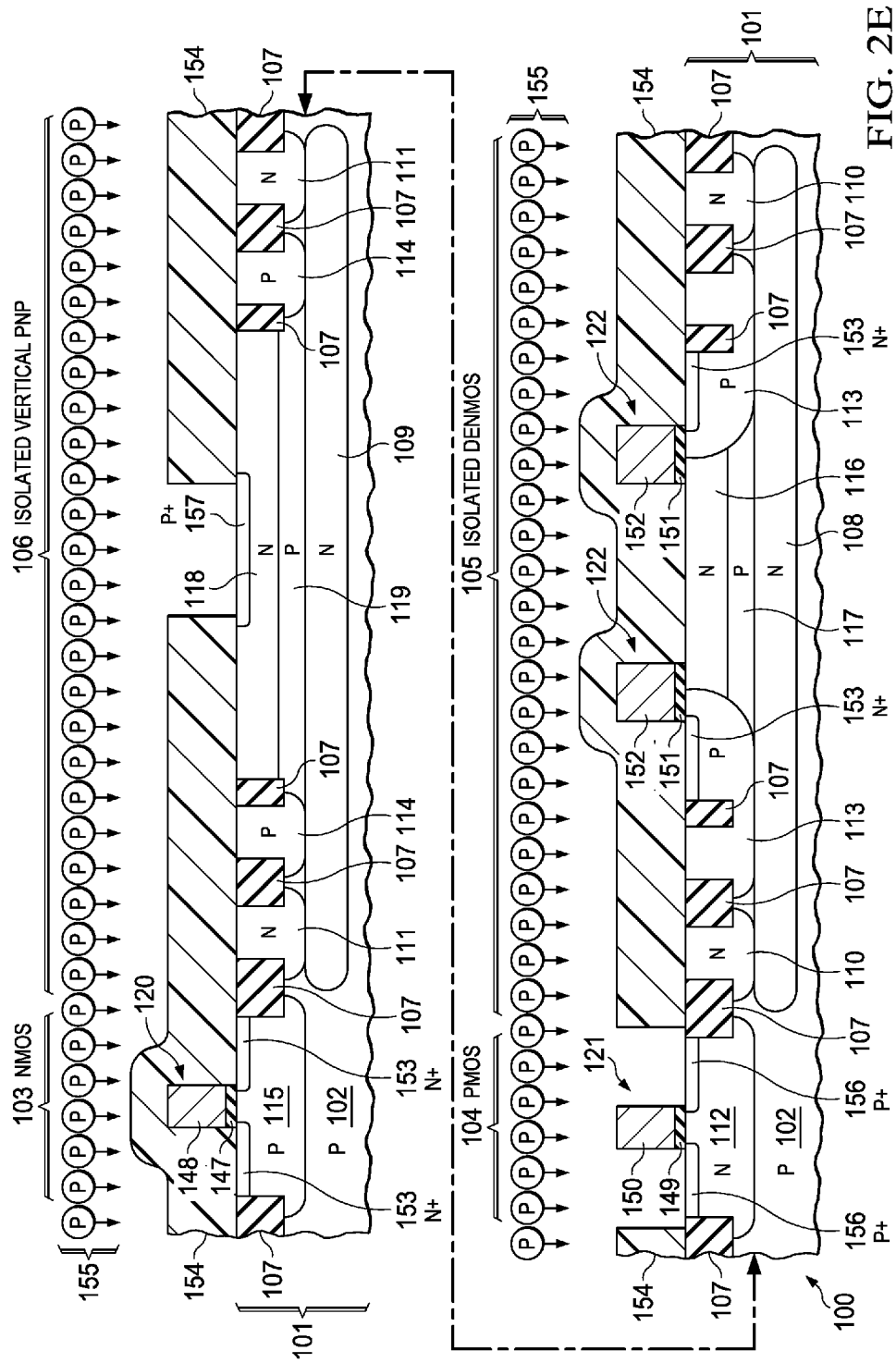

Referring to FIG. 2E, a first gate dielectric layer 147 and a first gate 148 of the first gate structure 120 are formed on the substrate 101 in the NMOS transistor 103. A second gate dielectric layer 149 and a second gate 150 of the second gate structure 121 are formed on the substrate 101 in the PMOS transistor 104. A third gate dielectric layer 151 and a third gate 152 of the third gate structure 122 are formed on the substrate 101 in the isolated n-channel DEMOS transistor 105.

N-type drain extensions 153 are formed in the substrate 101 adjacent to the first gate 148 of the NMOS transistor 103 and in the first shallow p-type well 113 adjacent to the third gate 152 of the isolated n-channel DEMOS transistor 105. The n-type drain extensions 153 may be formed, for example, by implanting n-type dopants such as phosphorus, arsenic and possibly antimony at a total dose of $1 \times 10^{14}$ cm$^{-2}$ to $1 \times 10^{16}$ cm', with energies to provide a depth of 10 nanometers to 150 nanometers.

A p-type drain extension mask 154 is formed over an existing top surface of the integrated circuit 100 which exposes areas for p-type drain extensions. P-type dopants 155 such as boron, and possibly gallium and/or indium, are implanted into the substrate 101 in the areas exposed by the p-type drain extension mask 154 to form PMOS drain extensions 156 adjacent to the second gate 150 in the PMOS transistor 104. Optionally, the p-type drain extension mask 154 may expose an emitter area of the isolated vertical PNP transistor 106 so that the p-type dopants 155 form an emitter enhancement layer 157 at the top surface of the substrate 101. The p-type dopants 155 may be implanted at a total dose of, for example, $1\times10^{14}$ cm$^{-2}$ to $1\times10^{16}$ cm$^{-2}$, with energies to provide a depth of 10 nanometers to 150 nanometers. The p-type drain extension mask 154 is subsequently removed and the substrate 101 is annealed to activate the implanted n-type dopants in the n-type drain extensions 153 and the implanted p-type dopants in the PMOS drain extensions 156 and the emitter enhancement layer 157. In one version of the instant example, the implanted n-type dopants in the n-type drain extensions 153 may be activated in a separate anneal.

Figure 2F:
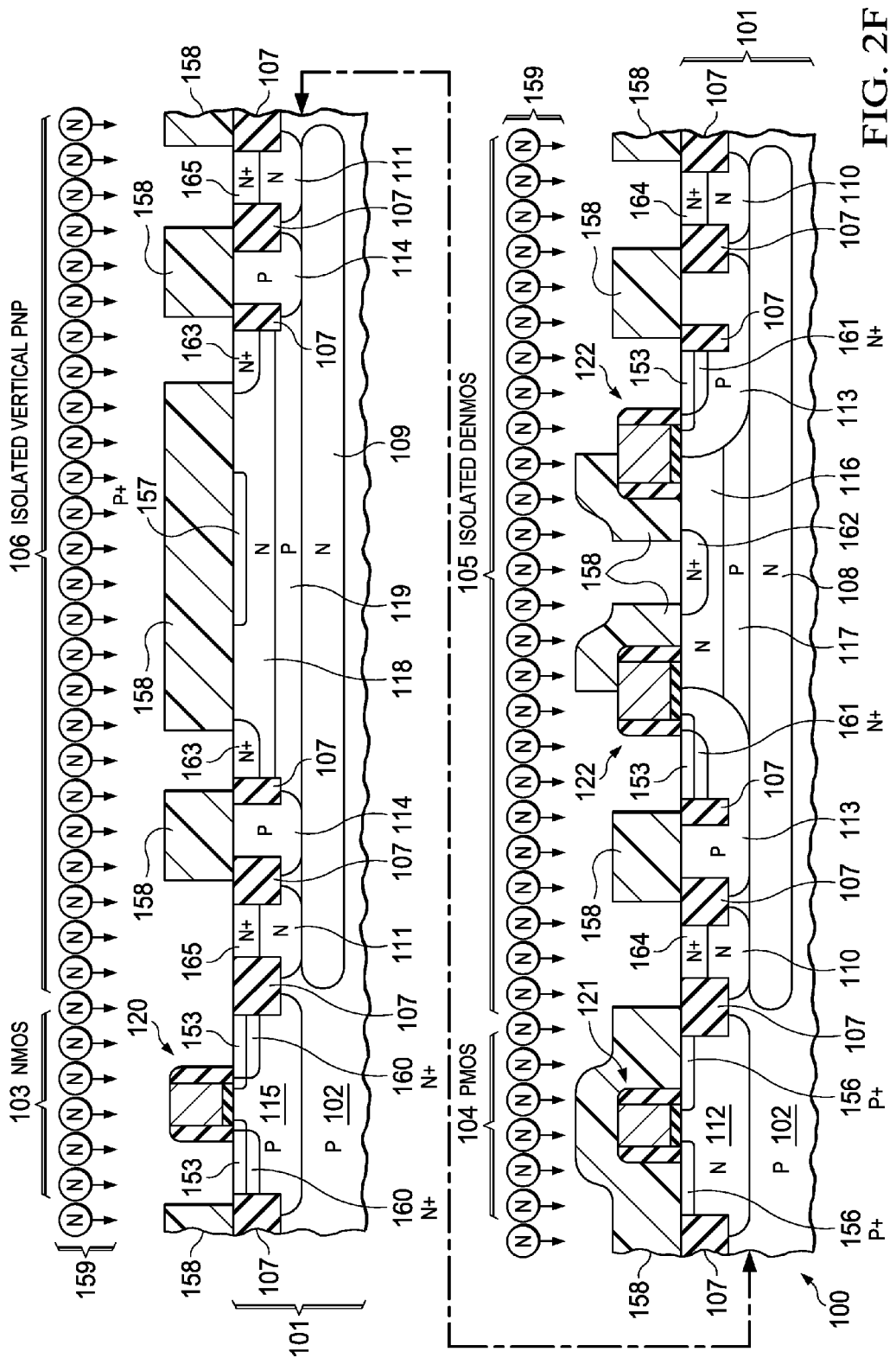

Referring to FIG. 2F, an n-type diffused region mask 158 is formed over an existing top surface of the integrated circuit 100 which exposes areas for n-type diffused regions. N-type dopants 159 such as phosphorus, arsenic and possibly antimony are implanted into the substrate 101 to form NMOS source and drain implanted regions 160 adjacent to the first gate structure 120 in the NMOS transistor 103, to form a source implanted region 161 adjacent to the third gate structure 122 in the isolated n-channel DEMOS transistor 105, to form a drain implanted region 162 in the drain extension region 116 of the isolated n-channel DEMOS transistor 105, to form a base contact implanted region 163 in the second upper n-type layer 118 of the isolated vertical PNP transistor 106, to form an isolation contact implanted region 164 in the first shallow n-type well 110, and to form an isolation contact implanted region 165 in the second shallow n-type well 111. The n-type dopants 159 may be implanted, for example, at a total dose of $1\times10^{15}$ cm$^{-2}$ to $1\times10^{16}$ cm$^{-2}$, with energies to provide a depth of 15 nanometers to 300 nanometers. The n-type diffused region mask 158 is removed after the n-type dopants 159 are implanted.

Figure 2G:
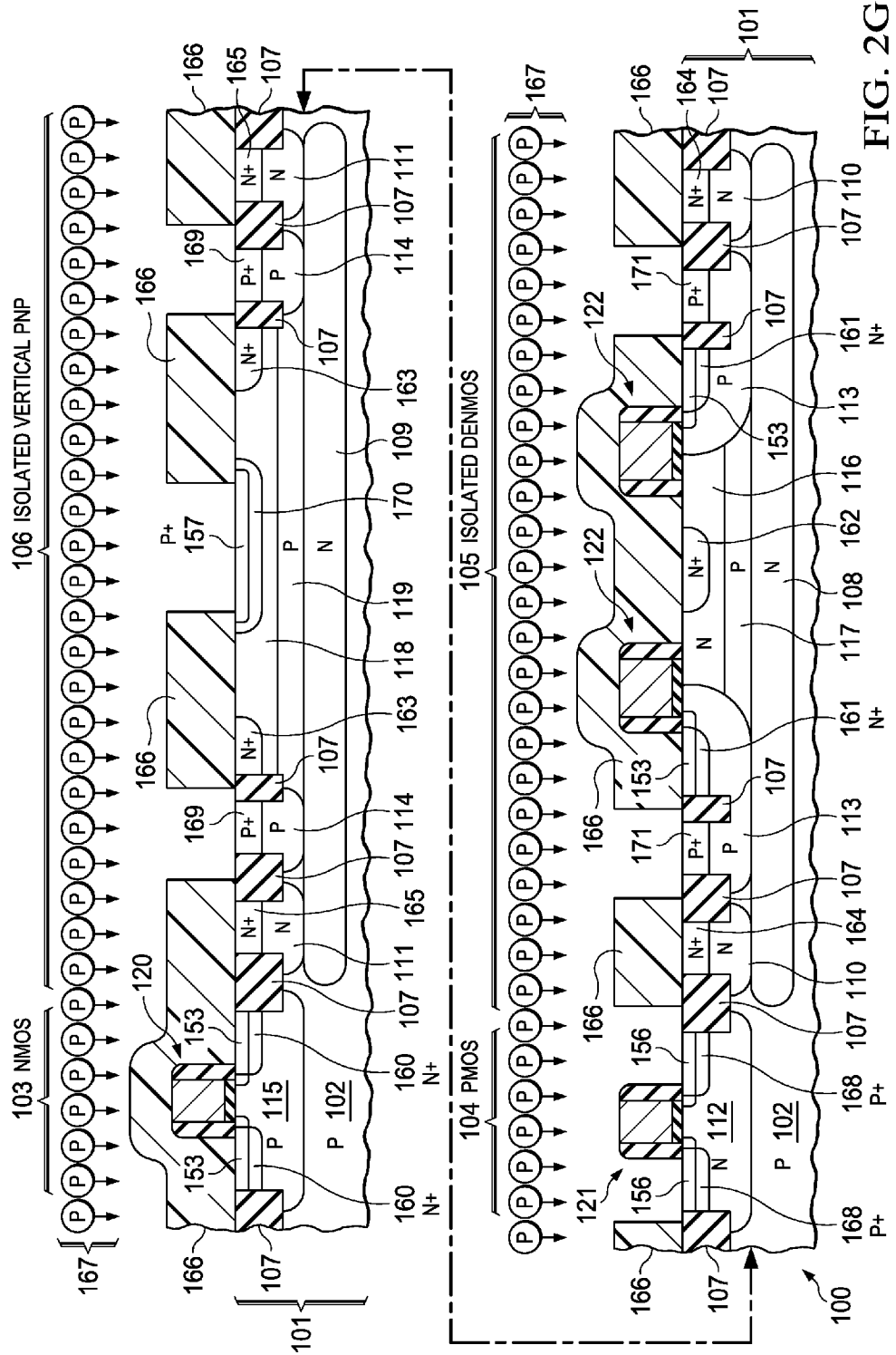

Referring to FIG. 2G, a p-type diffused region mask 166 is formed over an existing top surface of the integrated circuit 100 which exposes areas for p-type diffused regions. P-type dopants 167 such as boron, and possibly gallium and/or indium, are implanted into the substrate 101 to form PMOS source and drain implanted regions 168 adjacent to the second gate structure 121 in the PMOS transistor 104, to form a collector contact implanted region 169 in the second shallow p-type well 114 of the isolated vertical PNP transistor 106, to form an emitter implanted region 170 in the second upper n-type layer 118 of the isolated vertical PNP transistor 106, and to form a body contact implanted region 171 in the first shallow p-type well 113 providing the body region for the isolated n-channel DEMOS transistor 105. The p-type dopants 167 may be implanted, for example, at a total dose of $1\times10^{15}$ cm$^{-2}$ to $1\times10^{16}$ cm$^{-2}$, with energies to provide a depth of 15 nanometers to 300 nanometers. The p-type diffused region mask 166 is removed after the p-type dopants 167 are implanted.

Figure 2H:
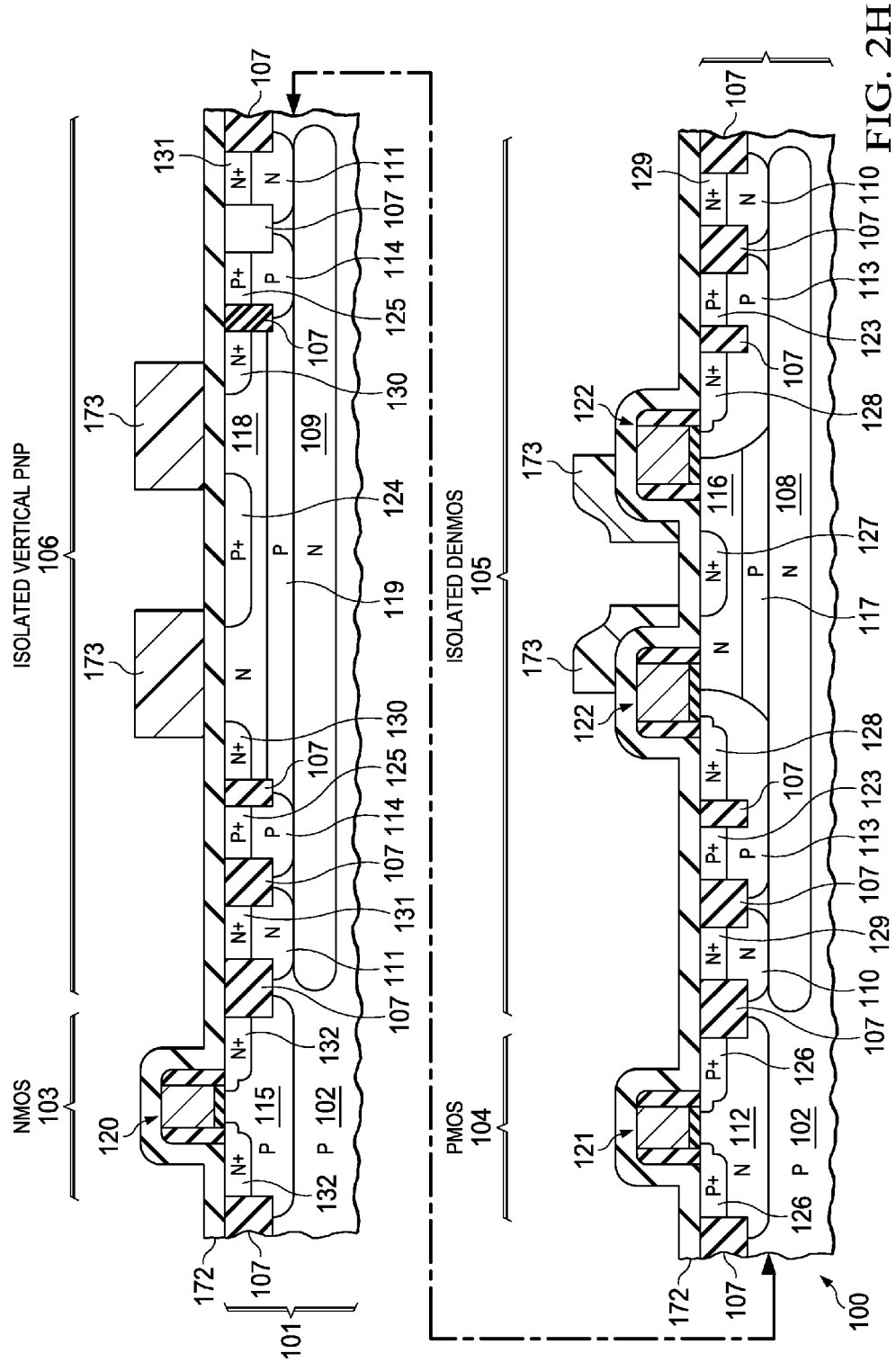

Referring to FIG. 2H, the substrate 101 is annealed to activate the implanted n-type dopants described in reference to FIG. 2F and the implanted p-type dopants described in reference to FIG. 2G, so as to form the first n-type diffused region 127 which provides the drain contact region of the isolated n-channel DEMOS transistor 105, the second n-type diffused region 128 which provides the source region of the isolated n-channel DEMOS transistor 105, the third n-type diffused region 129 which provides the contact region of the first shallow n-type well 110 of the isolated n-channel DEMOS transistor 105, the fourth n-type diffused region 130 which provides the base contact region of the isolated vertical PNP transistor 106, the fifth n-type diffused region 131 which provides the contact region of the second shallow n-type well 111 of the isolated vertical PNP transistor 106, the sixth n-type diffused regions 132 which provide source and drain regions of the NMOS transistor 103, the first p-type diffused region 123 which provides the body contact region of the isolated n-channel DEMOS transistor 105, the second p-type diffused region 124 which provides the emitter of the isolated vertical PNP transistor 106, the third p-type diffused region 125 which provides the collector contact region of the isolated vertical PNP transistor 106, and the fourth p-type diffused regions 126 which provide the source and drain regions of the PMOS transistor 104.

A silicide block layer 172 is formed over an existing top surface of the integrated circuit 100. The silicide block layer 172 may include, for example, 10 nanometers to 50 nanometers of silicon nitride and/or silicon dioxide, formed using a plasma enhanced chemical vapor deposition (PECVD) process. A silicide block mask 173 is formed over the silicide block layer 172 to cover an area between the second p-type diffused region 124 which provides the emitter of the isolated vertical PNP transistor 106 and the fourth n-type diffused region 130 which provides the base contact region of the isolated vertical PNP transistor 106, and to cover an area between the third gate structure 122 which provides the gate structure of the isolated n-channel DEMOS transistor 105 and the first n-type diffused region 127 which provides the drain contact region of the isolated n-channel DEMOS transistor 105.

Figure 2I:
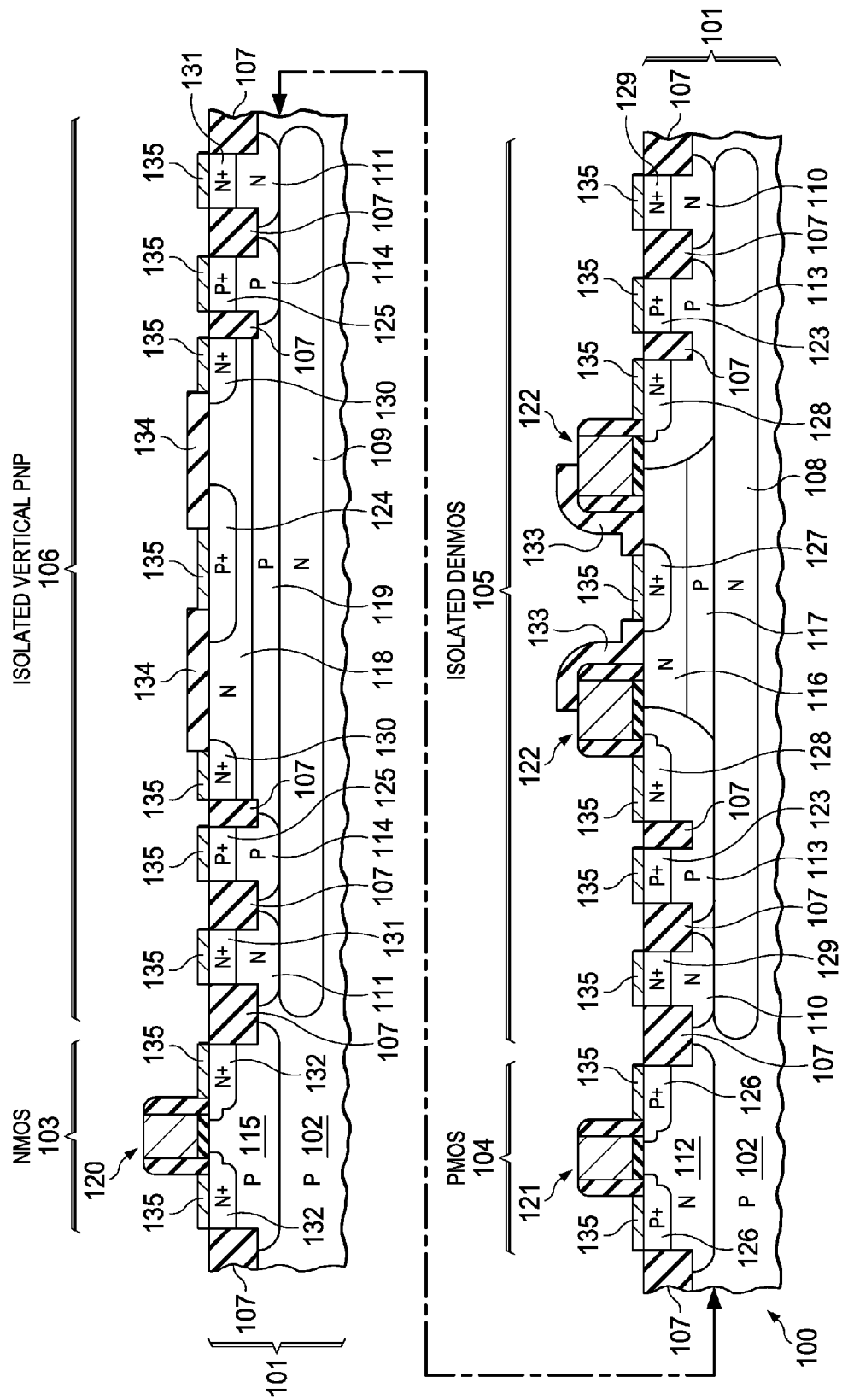

Referring to FIG. 2I, the silicide block layer 172 of FIG. 2H is removed in areas exposed by the silicide block mask 173, leaving the first silicide block portion 133 disposed on the isolated n-channel DEMOS transistor 105, and leaving the second silicide block portion 134 disposed on the isolated vertical PNP transistor 106. The silicide block mask 173 is subsequently removed. The metal silicide 135 is formed on exposed semiconductor material at an existing top surface of the substrate 101. The metal silicide 135 is not formed on the first silicide block portion 133 and the second silicide block portion 134. Forming the second silicide block portion 134 to prevent the metal silicide 135 from shorting the first n-type diffused region 127, which provides the drain contact region of the isolated n-channel DEMOS transistor 105, to the second upper n-type layer 118, which provides the base of the isolated vertical PNP transistor 106, advantageously reduces cost and fabrication complexity of the integrated circuit compared to forming a separate dielectric layer to block the metal silicide formation. After the metal silicide 135 is formed, the PMD layer 136 and contacts 137 of FIG. 1 are formed.

Figure 3A:
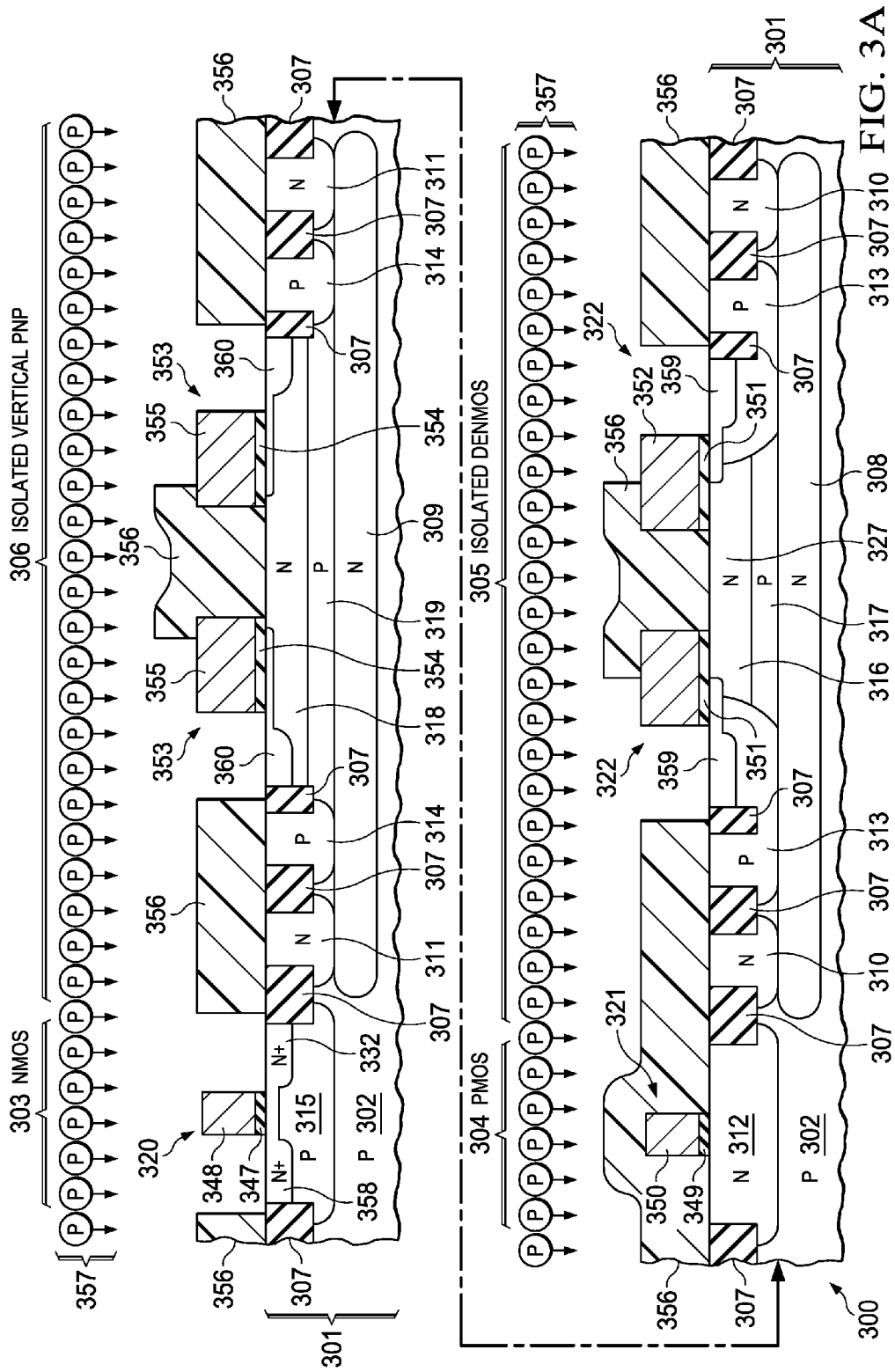
FIG. 3A and FIG. 3B are cross sections of another example integrated circuit.
Figure 3B:
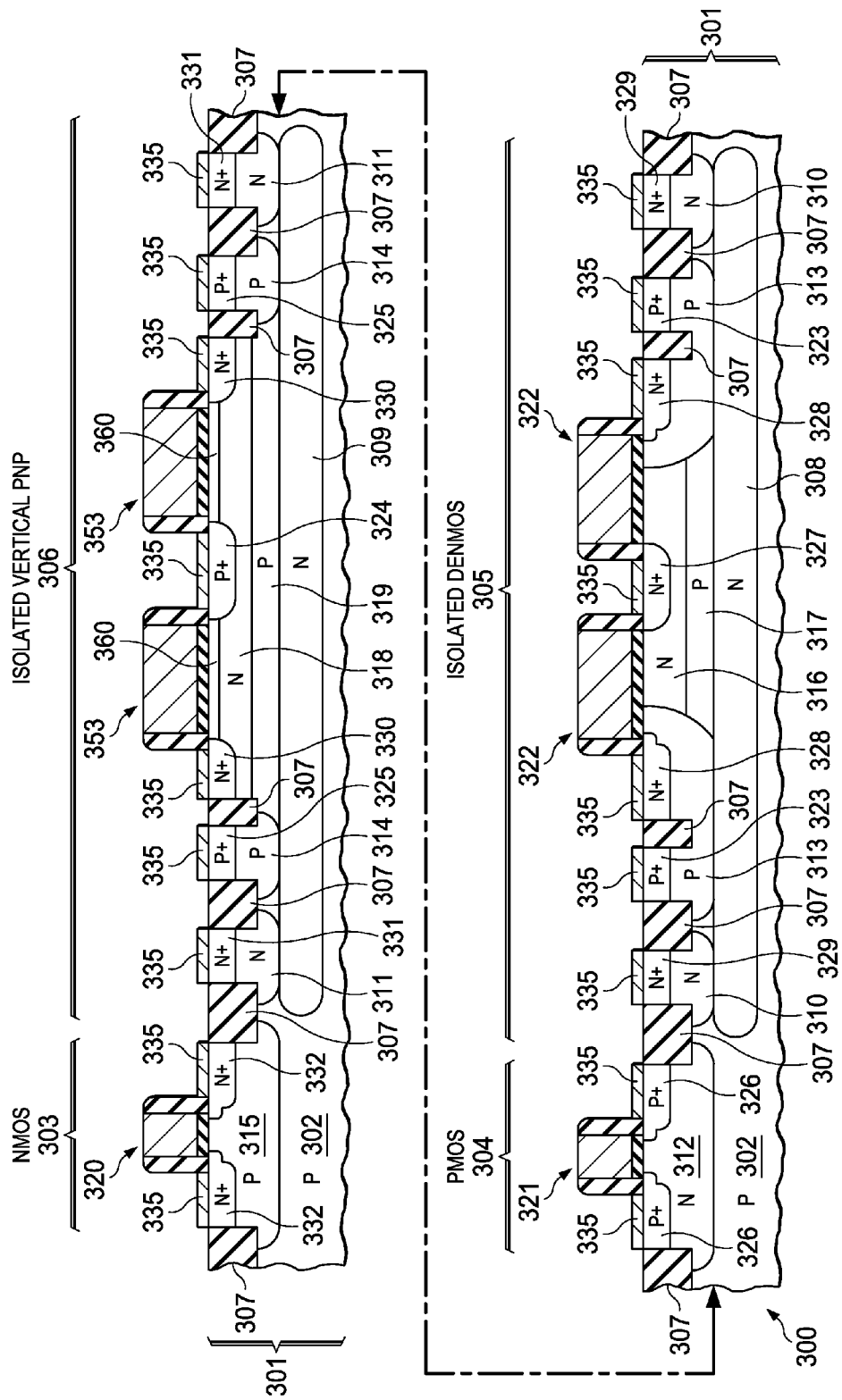

FIG. 3A and FIG. 3B are cross sections of another example integrated circuit. The integrated circuit 300 is formed on a substrate 301 which includes p-type semiconductor material 302 with an average doping density of $1\times10^{16}$ cm$^{-3}$ to $1\times10^{17}$ cm$^{-3}$ extending to a top surface of the substrate 301. The integrated circuit 300 includes an NMOS transistor 303, a PMOS transistor 304, an isolated n-channel DEMOS transistor 305 and an isolated vertical PNP transistor 306. Field oxide 307 is disposed at a top surface of the substrate 301 so as to laterally isolate the NMOS transistor 303, the PMOS transistor 304, the isolated n-channel DEMOS transistor 305 and the isolated vertical PNP transistor 306.

A first deep n-type well 308 is formed under the isolated n-channel DEMOS transistor 305 and a second deep n-type well 309 is concurrently formed under the isolated vertical PNP transistor 306. A plurality of shallow n-type wells is formed concurrently in the substrate 301, including a first shallow n-type well 310 surrounding the isolated n-channel DEMOS transistor 305, a second shallow n-type well 311 surrounding the isolated vertical PNP transistor 306, and a third shallow n-type well 312 providing a body region for the PMOS transistor 304. A plurality of shallow p-type wells is formed concurrently in the substrate 301, including a first shallow p-type well 313 providing a body region for the isolated n-channel DEMOS transistor 305, a second shallow p-type well 314 providing connection to a collector of the isolated vertical PNP transistor 306, and a third shallow p-type well 315 providing a body region for the NMOS transistor 303. A plurality of pairs of upper n-type layers and lower p-type layers is formed concurrently in the substrate 301, including a first upper n-type layer 316 providing an extended drain of the isolated n-channel DEMOS transistor 305, and a corresponding first lower p-type layer 317 isolating the extended drain from the first deep n-type well 308, and a second upper n-type layer 318 providing a base of the isolated vertical PNP transistor 306, and a corresponding second lower p-type layer 319 providing the collector of the isolated vertical PNP transistor 306. The deep n-type wells 308 and 309, the plurality of shallow n-type wells, the plurality of shallow p-type wells, and the plurality of pairs of upper n-type layers and lower p-type layers may have properties as described in reference to FIG. 1.

A plurality of gate structures is formed concurrently on the substrate 301. A first gate structure 320, including a first gate dielectric layer 347 and a first gate 348, provides a gate structure of the NMOS transistor 303. A second gate structure 321, including a second gate dielectric layer 349 and a second gate 350, provides a gate structure of the PMOS transistor 304. A third gate structure 322, including a third gate dielectric layer 351 and a third gate 352, provides a gate structure of the isolated n-channel DEMOS transistor 305. A fourth gate structure 353, including a fourth gate dielectric layer 354 and a fourth gate 355, is disposed on the isolated vertical PNP transistor 306 to block metal silicide between an emitter and a base contact region. The integrated circuit 300 may be formed using a process sequence free of a silicide blocking dielectric layer such as that described in reference to FIG. 1, so that forming the fourth gate structure 353 to block metal silicide in the isolated vertical PNP transistor 306 may advantageously reduce cost and fabrication complexity compared to an integrated circuit with another silicide blocking structure.

An optional threshold adjustment mask 356 may be formed over an existing top surface of the integrated circuit 300 which exposes areas in n-channel transistors for through-gate implants of n-type dopants to adjust thresholds. In the NMOS transistor 303, the threshold adjustment mask 356 exposes the first gate structure 320 and adjacent source and drain areas. In the isolated n-channel DEMOS transistor 305, the threshold adjustment mask 356 exposes a portion of the third gate structure 322 overlying the first shallow p-type well 313 and an adjacent source region. In the isolated vertical PNP transistor 306, the threshold adjustment mask 356 exposes the fourth gate structure 353 and possibly adjacent base contact regions.

N-type dopants 357 such as phosphorus are implanted into the substrate 301 in areas exposed by the threshold adjustment mask 356. The n-type dopants 357 may be implanted at a dose of, for example, $1 \times 10^{11}$ cm$^{-2}$ to $1 \times 10^{12}$ cm$^{-2}$, with sufficient energy to place a peak of the implanted n-type dopants 357 immediately below the gate dielectric layers 347, 351 and 354. In the NMOS transistor 303, the implanted n-type dopants 357 form an NMOS threshold adjustment region 358. In the isolated n-channel DEMOS transistor 305, the implanted n-type dopants 357 form a DEMOS threshold adjustment region 359. In the isolated vertical PNP transistor 306, the implanted n-type dopants 357 form a base augmentation region 360 which extends under the fourth gate dielectric layer 354 proximate to the to-be-formed emitter. The threshold adjustment mask 356 is subsequently removed and the substrate 101 is annealed to activate the implanted n-type dopants 357. During operation of the isolated vertical PNP transistor 306, the base augmentation region 360 may reduce a depletion region between the emitter and the base at the fourth gate dielectric layer 354, which may reduce leakage current from the depletion region due to defects from formation of the fourth gate dielectric layer 354 and thus advantageously improve a current gain of the isolated vertical PNP transistor 306.

Referring to FIG. 3B, a plurality of p-type diffused regions are concurrently formed in the substrate 301, including a first p-type diffused region 323 providing a body contact region of the isolated n-channel DEMOS transistor 305, a second p-type diffused region 324 providing an emitter of the isolated vertical PNP transistor 306, a third p-type diffused region 325 providing a collector contact region of the isolated vertical PNP transistor 306, and a pair of fourth p-type diffused regions 326 providing source and drain regions of the PMOS transistor 304. A plurality of n-type diffused regions are concurrently formed in the substrate 301, including a first n-type diffused region 327 providing a drain contact region of the isolated n-channel DEMOS transistor 305, a second n-type diffused region 328 providing a source region of the isolated n-channel DEMOS transistor 305, a third n-type diffused region 329 provides a contact region of the first shallow n-type well 310, a fourth n-type diffused region 330 providing a base contact region of the isolated vertical PNP transistor 306, a fifth n-type diffused region 331 providing a contact region of the second shallow n-type well 311, and a pair of sixth n-type diffused regions 332 providing source and drain regions of the NMOS transistor 303. The plurality of p-type diffused regions 323, 324, 325 and 326, and the plurality of n-type diffused regions 327, 328, 329, 330, 331, and 332 may have similar properties as those described in reference to FIG. 1. Metal silicide 335 is formed on exposed semiconductor material at an existing top surface of the substrate 301. The fourth gate structure 353 advantageously prevents the metal silicide 335 from shorting the emitter 324 to the base 318 in the isolated vertical PNP transistor 306.

Figure 4:
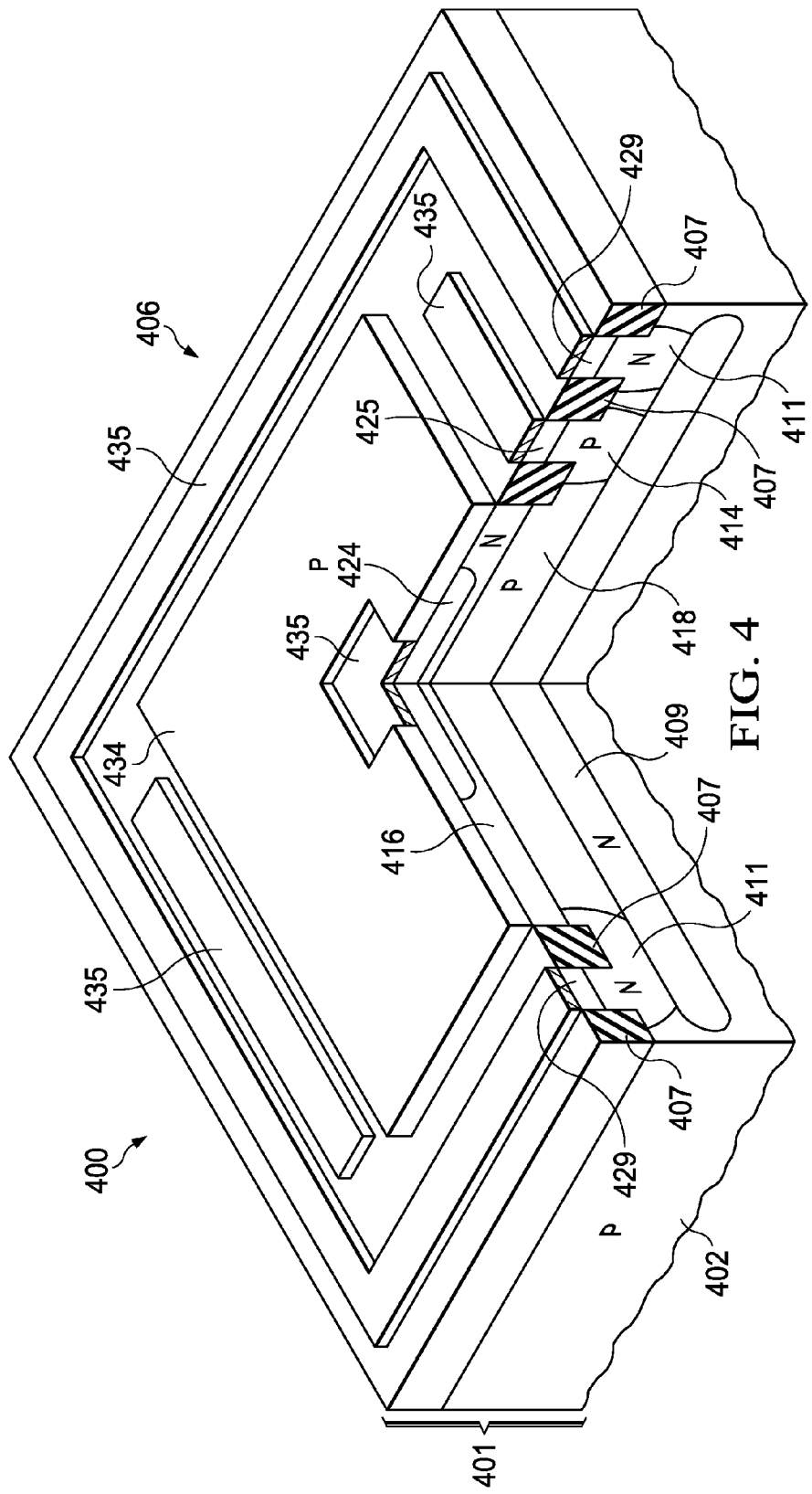
FIG. 4 is a cross section of a further example integrated circuit.

FIG. 4 is a cross section of a further example integrated circuit. The integrated circuit 400 is formed on a substrate 401 which includes p-type semiconductor material 402 at a top surface of the substrate 401. The integrated circuit 400 includes an isolated vertical PNP transistor 406, and an NMOS transistor, a PMOS transistor, and an isolated n-channel DEMOS transistor, not shown in FIG. 4.

A deep n-type well 409 underlies the isolated vertical PNP transistor 406. A shallow n-type well 411 surrounds the isolated vertical PNP transistor 406, connecting with the deep n-type well 409 so as to isolate the isolated vertical PNP transistor 406 from the p-type semiconductor material 402 of the substrate 401. An n-type diffused region 429 provides a contact region of the shallow n-type well 411 which is part of the isolation of the isolated vertical PNP transistor 406. Field oxide 407 is disposed at the top surface of the substrate 401, separating the n-type diffused region 429 from an upper n-type layer 416 which provides a base of the isolated vertical PNP transistor 406. The shallow n-type well 411 extends below the field oxide 407 and contacts the upper n-type layer 416 along two sides of the isolated vertical PNP transistor 406 to provide a connection between the n-type diffused region 429 and the base 416. Forming the shallow n-type well 411 to extend below the field oxide 407 to contact the base 416 advantageously provides a compact configuration for the isolated vertical PNP transistor 406, and thus may reduce a cost of the integrated circuit 400.

A lower p-type layer 418 is located under the upper n-type layer 416 and provides the collector 418 of the isolated vertical PNP transistor 406. The upper n-type layer 416 and the lower p-type layer 418 may have properties as described in reference to FIG. 1. Shallow p-type wells 414 extend down past the upper n-type layer 416 on two sides of the isolated vertical PNP transistor 406 to provide connections to the collector 418. A plurality of p-type diffused regions 425 is located in the shallow p-type wells 414 to provide collector contact regions 425. Forming the shallow p-type wells 414 on two sides of the isolated vertical PNP transistor 406 to provide connections to the collector 418, and forming the shallow n-type well 411 along two different sides from the shallow p-type wells 414 to provide the connections to the base 416 also advantageously provides a compact configuration for the isolated vertical PNP transistor 406, and thus may reduce a cost of the integrated circuit 400.

A p-type diffused region 424 which provides an emitter of the isolated vertical PNP transistor 406 is centrally located in the base 416. A silicide block layer 434 is disposed over the substrate 401, with openings for the emitter 424 and the shallow p-type wells 414 providing connections to the collector. Metal silicide 435 is formed on the n-type diffused region 429 providing the contact region of the shallow n-type well 411, on the plurality of p-type diffused regions 425 providing collector contact regions, and on the p-type diffused region 424 providing the emitter.

Figure 5:
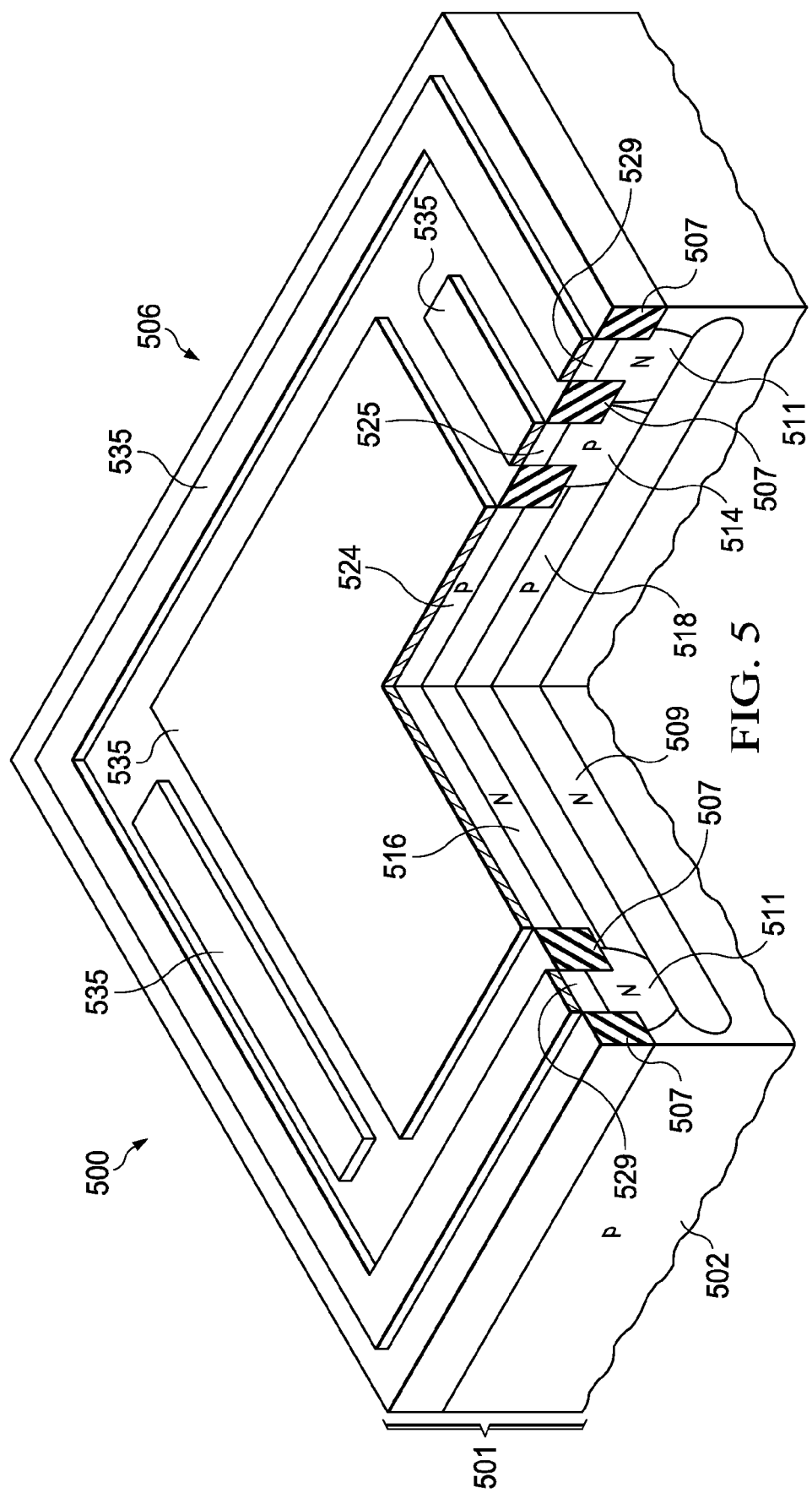
FIG. 5 is a cross section of a further example integrated circuit.

FIG. 5 is a cross section of a further example integrated circuit. The integrated circuit 500 is formed on a substrate 501 which includes p-type semiconductor material 502 at a top surface of the substrate 501. The integrated circuit 500 includes an isolated vertical PNP transistor 506, and an NMOS transistor, a PMOS transistor, and an isolated n-channel DEMOS transistor, not shown in FIG. 5.

A deep n-type well 509 underlies the isolated vertical PNP transistor 506. A shallow n-type well 511 surrounds the isolated vertical PNP transistor 506, connecting with the deep n-type well 509 so as to isolate the isolated vertical PNP transistor 506 from the p-type semiconductor material 502 of the substrate 501. An n-type diffused region 529 provides a contact region of the shallow n-type well 511 which is part of the isolation of the isolated vertical PNP transistor 506. An upper n-type layer 516 provides a base 516 of the isolated vertical PNP transistor 506.

A lower p-type layer 518 is located under the upper n-type layer 516 and provides the collector 518 of the isolated vertical PNP transistor 506. The upper n-type layer 516 and the lower p-type layer 518 may have properties as described in reference to FIG. 1. Shallow p-type wells 514 extend down past the upper n-type layer 516 on two sides of the isolated vertical PNP transistor 506 to provide connections to the collector 518. A plurality of p-type diffused regions 525 is located in the shallow p-type wells 514 to provide collector contact regions 525. A p-type diffused region 524 which provides an emitter 524 of the isolated vertical PNP transistor 506 is centrally located in the base 516.

Field oxide 507 is disposed at the top surface of the substrate 501, separating the emitter 524 from the shallow n-type well 511 surrounding the isolated vertical PNP transistor 506. The upper n-type layer 516 providing the base 516 extends below the field oxide 507 to contact the shallow n-type well 511 on two sides of the isolated vertical PNP transistor 506. The n-type diffused region 529 in combination with the shallow n-type well 511 thus provides a connection to the base 516. Forming the upper n-type layer 516 to extend below the field oxide 507 to provide the connection to the base 516 advantageously provides a compact configuration for the isolated vertical PNP transistor 506, and thus may reduce a cost of the integrated circuit 500. Forming the connections to the collector 518 on two sides of the isolated vertical PNP transistor 506, and forming the connections to the base 516 along two different sides from the shallow p-type wells 514 also advantageously provides a compact configuration for the isolated vertical PNP transistor 506, and thus may reduce a cost of the integrated circuit 500. Metal silicide 535 is formed on the n-type diffused region 529 providing the contact region of the shallow n-type well 511, on the plurality of p-type diffused regions 525 providing collector contact regions, and on the p-type diffused region 524 providing the emitter.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
   providing a substrate comprising a p-type semiconductor material, said substrate including an area for an NMOS transistor, an area for a PMOS transistor, an area for an isolated n-channel DEMOS transistor, and an area for an isolated vertical PNP transistor;
   concurrently forming a first shallow n-type well surrounding said isolated n-channel DEMOS transistor, a second shallow n-type well surrounding said isolated vertical PNP transistor, and third shallow n-type well providing a body region for said PMOS transistor of said integrated circuit;
   concurrently forming a first deep n-type well underlying said isolated n-channel DEMOS transistor and a second deep n-type well underlying said isolated vertical PNP transistor, so that said first shallow n-type well connects with said first deep n-type well so as to isolate said isolated n-channel DEMOS transistor from said p-type semiconductor material of said substrate, and said second shallow n-type well connects with said second deep n-type well so as to isolate said isolated vertical PNP transistor from said p-type semiconductor material of said substrate;
   concurrently forming a first upper n-type layer providing an extended drain of said isolated n-channel DEMOS transistor and a second upper n-type layer providing a base of said isolated vertical PNP transistor; and
   concurrently forming a first lower p-type layer below said first upper n-type layer and a second lower p-type layer below said second upper n-type layer, said second lower p-type layer providing a collector of said isolated vertical PNP transistor.

2. The method of claim 1, further comprising concurrently forming:
   a first shallow p-type well providing a body region for said isolated n-channel DEMOS transistor;
   a second shallow p-type well providing connection to said collector of said isolated vertical PNP transistor; and a third shallow p-type well providing a body region for said NMOS transistor.

3. The method of claim 1, further comprising concurrently forming:
- a first p-type diffused region which provides a body contact region of said isolated n-channel DEMOS transistor;
- a second p-type diffused region which provides an emitter of said isolated vertical PNP transistor;
- a third p-type diffused region which provides a collector contact region of said isolated vertical PNP transistor; and
- a pair of fourth p-type diffused regions which provides source and drain regions of said PMOS transistor.

4. The method of claim 1, further comprising the steps: concurrently forming:
- a first silicide block portion of a silicide block layer is disposed on said isolated n-channel DEMOS transistor between a drain contact region of said isolated n-channel DEMOS transistor and a gate structure of said isolated n-channel DEMOS transistor; and
- a second silicide block portion of said silicide block layer is disposed on said isolated vertical PNP transistor between an emitter of said isolated vertical PNP transistor and a base contact region of said isolated vertical PNP transistor; and forming metal silicide on exposed areas of semiconductor material at a top surface of said substrate, such that:
- said first silicide block portion blocks said metal silicide between said drain contact region of said isolated n-channel DEMOS transistor and said gate structure of said isolated n-channel DEMOS transistor; and
- second silicide block portion blocks said metal silicide between said emitter of said isolated vertical PNP transistor and said base contact region of said isolated vertical PNP transistor.

5. The method of claim 1, further comprising the steps: concurrently forming:
- a first gate structure of said NMOS transistor;
- a second gate structure of said PMOS transistor;
- a third gate structure of said isolated n-channel DEMOS transistor; and
- a fourth gate structure of said isolated vertical PNP transistor, such that said fourth gate structure is disposed between an emitter of said isolated vertical PNP transistor and a base contact region of said isolated vertical PNP transistor; and forming metal silicide on exposed areas of semiconductor material at a top surface of said substrate, such that fourth gate structure blocks said metal silicide between said emitter of said isolated vertical PNP transistor and said base contact region of said isolated vertical PNP transistor.

6. The method of claim 5, further comprising concurrently implanting n-type dopants through said first gate structure of said NMOS transistor and through said fourth gate structure of said isolated vertical PNP transistor.

7. The method of claim 5, further comprising concurrently implanting n-type dopants through said third gate structure of said isolated n-channel DEMOS transistor and through said fourth gate structure of said isolated vertical PNP transistor.

8. The method of claim 1, in which said second shallow n-type well is formed so as to extend under an element of field oxide and contact said second upper n-type layer providing said base of said isolated vertical PNP transistor.

9. The method of claim 1, in which said second upper n-type layer providing said base of said isolated vertical PNP transistor is formed so as to extend under an element of field oxide and contact said second shallow n-type well.

10. The method of claim 1, further comprising concurrently forming:
- a first shallow p-type well in said substrate, said first shallow p-type well providing a body region for said isolated n-channel DEMOS transistor;
- a second shallow p-type well in said substrate, said second shallow p-type well providing connection to said collector of said isolated vertical PNP transistor; and
- a third shallow p-type well in said substrate, said third shallow p-type well providing a body region for said NMOS transistor.

11. The method of claim 1, further comprising concurrently implanting p-type dopants into drain extension regions of said PMOS transistor and into an emitter region of said isolated vertical PNP transistor.

* * * * *